(12) United States Patent
Ishihara et al.

(10) Patent No.: US 11,031,910 B2
(45) Date of Patent: *Jun. 8, 2021

(54) POWER AMPLIFIER MODULE

(71) Applicant: Murata Manufacturing Co., Ltd., Kyoto (JP)

(72) Inventors: Shota Ishihara, Kyoto (JP); Yasuhisa Yamamoto, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/917,817

(22) Filed: Jun. 30, 2020

(65) Prior Publication Data

US 2020/0336106 A1 Oct. 22, 2020

Related U.S. Application Data

(63) Continuation of application No. 16/371,349, filed on Apr. 1, 2019, now Pat. No. 10,734,952, which is a continuation of application No. 15/896,701, filed on Feb. 14, 2018, now Pat. No. 10,291,182.

(30) Foreign Application Priority Data

Feb. 17, 2017 (JP) .............................. JP2017-028227

(51) Int. Cl.
*H03F 1/02* (2006.01)
*H03F 1/56* (2006.01)
(Continued)

(52) U.S. Cl.
CPC ......... *H03F 1/0211* (2013.01); *H03F 1/0261* (2013.01); *H03F 1/30* (2013.01); *H03F 1/56* (2013.01); *H03F 3/19* (2013.01); *H03F 3/21* (2013.01); *H03F 2200/18* (2013.01); *H03F 2200/222* (2013.01); *H03F 2200/318* (2013.01);
(Continued)

(58) Field of Classification Search
CPC ........ H03F 1/0211; H03F 1/0261; H03F 1/30; H03F 3/19; H03F 3/21; H03F 1/56; H03F 2200/18; H03F 2200/411; H03F 2200/444; H03F 2200/447; H03F 2200/318;
(Continued)

(56) References Cited

U.S. PATENT DOCUMENTS 6,448,859 B2  9/2002  Morizuka
6,731,171 B2  5/2004  Yamashita
(Continued)

FOREIGN PATENT DOCUMENTS

CN   106357226 A    1/2017
JP   2002289835 A  10/2002
(Continued)

*Primary Examiner* — Hieu P Nguyen
(74) *Attorney, Agent, or Firm* — Pearne & Gordon LLP

(57) ABSTRACT

A power amplifier module includes a power amplifier circuit and a control IC. The power amplifier circuit includes a bipolar transistor that amplifies power of an RF signal and outputs an amplified signal. The control IC includes an FET, which serves as a bias circuit that supplies a bias signal to the bipolar transistor. The FET is operable at a threshold voltage lower than that of the bipolar transistor, thereby making it possible to decrease the operating voltage of the power amplifier module.

12 Claims, 5 Drawing Sheets

(51) Int. Cl.
*H03F 3/19* (2006.01)
*H03F 3/21* (2006.01)
*H03F 1/30* (2006.01)

(52) U.S. Cl.
CPC .. *H03F 2200/387* (2013.01); *H03F 2200/411* (2013.01); *H03F 2200/444* (2013.01); *H03F 2200/447* (2013.01); *H03F 2200/451* (2013.01)

(58) Field of Classification Search
CPC ......... H03F 2200/451; H03F 2200/222; H03F 2200/387; H03F 3/193; H03F 3/211
USPC .................. 330/285, 296, 289, 307
See application file for complete search history.

(56) References Cited

U.S. PATENT DOCUMENTS

| | | | |
|---|---|---|---|
| 6,937,101 B2 * | 8/2005 | Hageman | H03F 1/0261 330/127 |
| 6,990,323 B2 | 1/2006 | Prikhdko et al. | |
| 7,741,912 B1 * | 6/2010 | Nadimpalli | H03F 3/195 330/285 |
| 7,768,354 B2 | 8/2010 | Matsuda et al. | |
| 9,030,256 B2 | 5/2015 | Jones et al. | |
| 9,035,701 B2 | 5/2015 | Schoolety et al. | |
| 2004/0176053 A1 | 9/2004 | Yamashita | |
| 2007/0075782 A1 | 4/2007 | Nakai | |
| 2007/0096823 A1 | 5/2007 | Wang et al. | |
| 2010/0301945 A1 | 12/2010 | Wan | |
| 2012/0115426 A1 | 5/2012 | Andrys et al. | |
| 2017/0019081 A1 | 1/2017 | Hase | |

FOREIGN PATENT DOCUMENTS

| | | |
|---|---|---|
| JP | 2007288736 A | 11/2007 |
| TW | 200731660 A | 8/2007 |
| TW | 201025836 A1 | 7/2010 |
| TW | 201044773 A1 | 12/2010 |

* cited by examiner

POWER AMPLIFIER MODULE

This is a continuation of U.S. patent application Ser. No. 16/371,349 filed on Apr. 1, 2019, which is a continuation of U.S. patent application Ser. No. 15/896,701 filed on Feb. 14, 2018, which claims priority from Japanese Patent Application No. 2017-028227 filed on Feb. 17, 2017. The contents of these applications are incorporated herein by reference in their entireties.

BACKGROUND

The present disclosure relates to a power amplifier module. In a mobile communication terminal, such as a cellular phone, a power amplifier for amplifying a radio frequency (RF) signal to be transmitted to a base station is used. As this type of power amplifier, a power amplifier including a common-emitter heterojunction bipolar transistor (HBT) which amplifies an RF signal and an emitter-follower HBT which supplies a bias signal to the base terminal of this common-emitter HBT is known, as disclosed in Japanese Unexamined Patent Application Publication No. 2007-288736.

BRIEF SUMMARY

To drive the common-emitter HBT which amplifies an RF signal, the base-emitter voltage of about 1.3 V or higher is required. Likewise, to drive the emitter-follower HBT which supplies a bias signal, the base-emitter voltage of about 1.3 V or higher is required. Hence, to operate the power amplifier, the operating voltage of about 2.6 V is required. In a mobile communication terminal, the operating voltage is supplied from a battery. In order to operate the power amplifier correctly even if the battery voltage somewhat drops, it is desirable to decrease the operating voltage.

Accordingly, the present disclosure decreases the operating voltage of a power amplifier module.

According to embodiments of the present disclosure, there is provided a power amplifier module including a power amplifier circuit and a control integrated circuit (IC). The power amplifier circuit includes a bipolar transistor that amplifies power of a radio frequency (RF) signal and outputs an amplified signal, and a diode-connected bipolar transistor that is thermally coupled with the bipolar transistor. The control IC includes a field-effect transistor and a diode-connected field-effect transistor. A drain terminal of the field-effect transistor is connected to a battery voltage, and a bias signal is input into a gate terminal of the field-effect transistor and is supplied from a source terminal of the field-effect transistor to the bipolar transistor via a first wire. A cathode of the diode-connected bipolar transistor is grounded. An anode of the diode-connected bipolar transistor is connected to a cathode of the diode-connected field-effect transistor via a second wire. An anode of the diode-connected field-effect transistor is connected to the gate terminal of the field-effect transistor.

According to embodiments of the present disclosure, it is possible to decrease the operating voltage of a power amplifier module.

Other features, elements, and characteristics of the present disclosure will become more apparent from the following detailed description of embodiments of the present disclosure with reference to the attached drawings.

DETAILED DESCRIPTION

Figure 1:
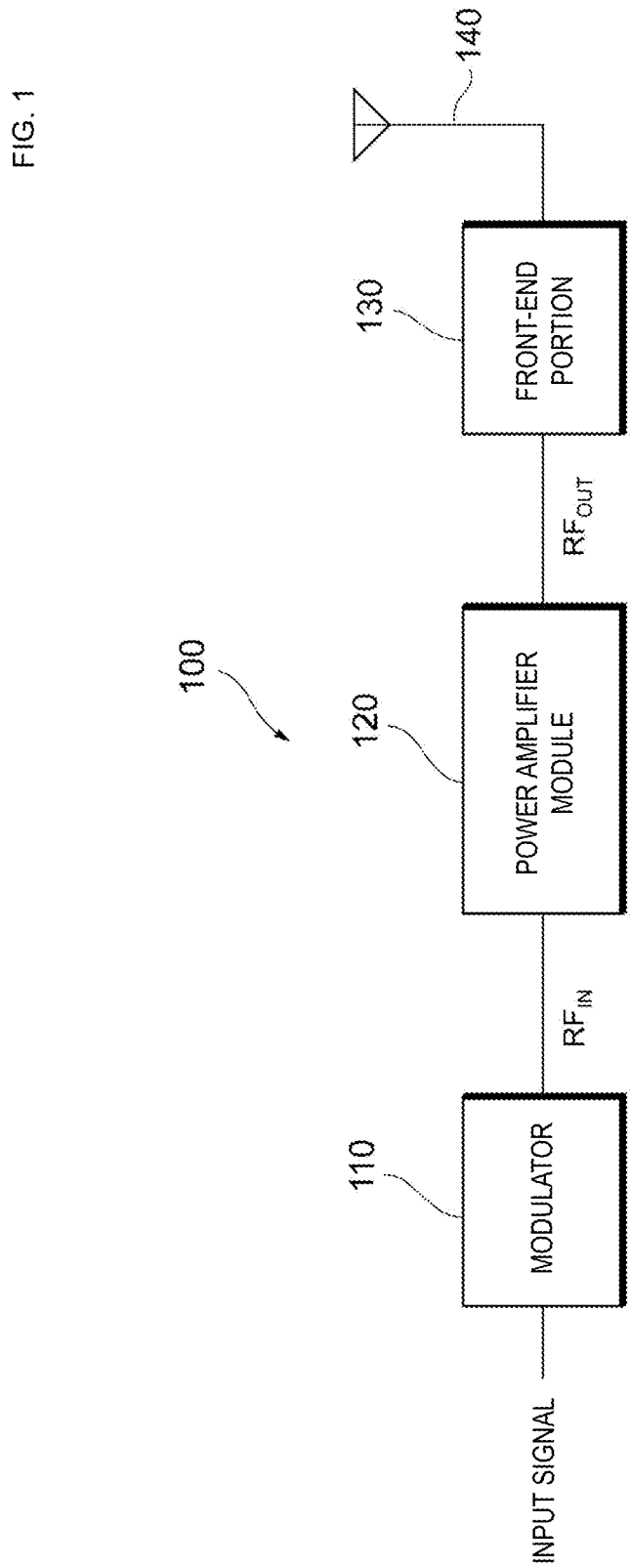
FIG. 1 illustrates an example of the configuration of a transmit unit according to a first embodiment of the disclosure.

Embodiments of the present disclosure will be described below with reference to the accompanying drawings. The same circuit element is designated by like reference numeral, and the same explanation thereof will not be repeated.

FIG. 1 illustrates an example of the configuration of a transmit unit 100 according to a first embodiment. The transmit unit 100 is used in a mobile communication device, such as a cellular phone, and for transmitting various signals, such as audio signals and data signals, to a base station. The mobile communication device also includes a receive unit for receiving signals from the base station, though an explanation thereof will be omitted.

The transmit unit 100 includes a modulator 110, a power amplifier module 120, a front-end portion 130, and an antenna 140. The modulator 110 modulates an input signal by using a modulation method, such as High-Speed Uplink Packet Access (HSUPA) or Long Term Evolution (LTE), so as to generate an RF signal. The frequency of the RF signal is about several hundreds of megahertz to several gigahertz. The power amplifier module 120 amplifiers power of the RF signal ($RF_{IN}$) output from the modulator 110 to a level high enough to be transmitted to a base station, and outputs the amplified signal ($RF_{OUT}$). The front-end portion 130, which is constituted by a band pass filter and an antenna switch, for example, performs filtering on the amplified signal ($RF_{OUT}$) and switches between signal paths. The amplified signal output from the front-end portion 130 is transmitted to the base station via the antenna 140.

Figure 2:
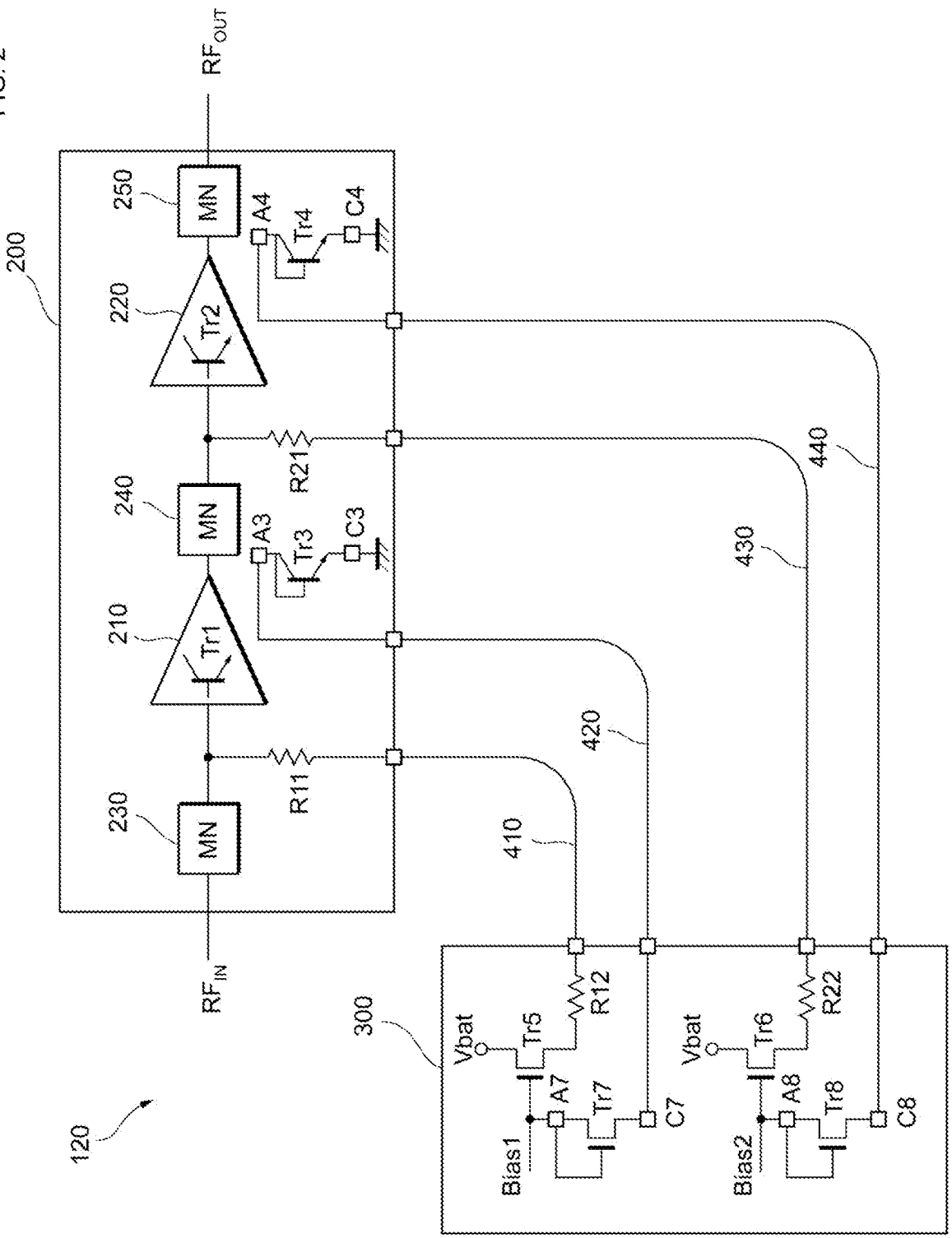
FIG. 2 illustrates an example of the configuration of a power amplifier module according to the first embodiment.

FIG. 2 illustrates an example of the configuration of the power amplifier module 120 according to the first embodiment. The power amplifier module 120 includes a power amplifier circuit 200 manufactured by a bipolar process, a control integrated circuit (IC) 300 manufactured by a metal-oxide-semiconductor (MOS) process, and wires 410, 420, 430, and 440 for connecting the power amplifier circuit 200 and the control IC 300. The power amplifier circuit 200 includes amplifiers 210 and 220, matching circuits 230, 240, and 250, bipolar transistors Tr3 and Tr4, and base ballast resistors R11 and R21. The amplifier 220 serves as an output-stage amplifier, while the amplifier 210 serves as a driver-stage amplifier connected to the input of the amplifier 220. Two stages of amplifiers 210 and 220 are used in the power amplifier circuit 200. However, the number of stages of amplifiers may be determined according to the output of the amplified signal ($RF_{OUT}$).

The amplifier 210 includes one or plural bipolar transistors Tr1 which amplify the RF signal ($RF_{IN}$) and output the amplified signal. The amplifier 210 may be formed in a multi-finger structure by using the bipolar transistor Tr1 as a finger (unit transistor) in which plural fingers are connected in parallel with each other. The amplifier 220 includes one or plural bipolar transistors Tr2 which amplify the RF signal amplified by the amplifier 210 and output the amplified signal ($RF_{OUT}$). The amplifier 220 may be formed in a multi-finger structure by using the bipolar transistor Tr2 as a finger (unit transistor) in which plural fingers are connected in parallel with each other. The bipolar transistors Tr1 and Tr2 are common-emitter transistors, for example. The bipolar transistors Tr1 and Tr2 may be heterojunction bipolar transistors (HBTs), for example. The matching circuit 230 is connected to the input of the amplifier 210. The matching circuit 240 is connected between the amplifiers 210 and 220. The matching circuit 250 is connected to the output of the amplifier 220. The matching circuits 230, 240, and 250, each performs impedance matching between the preceding-stage circuit and the following-stage circuit.

The control IC 300 includes field-effect transistors (FETs) Tr5, Tr6, Tr7, and Tr8 and base ballast resistors R12 and R22.

The FET Tr5 serves as a bias circuit which supplies a bias signal Bias1 to the amplifier 210 via the wire 410. The drain terminal of the FET Tr5 is connected to the battery voltage Vbat, and the bias signal Bias1 is input into the gate terminal of the FET Tr5 and is supplied from the source terminal to the amplifier 210 via the wire 410. The base ballast resistor R11 is connected between the input of the amplifier 210 and the wire 410. Similarly, the base ballast resistor R12 is connected between the source terminal of the FET Tr5 and the wire 410. When the bipolar transistor Tr1 is a common-emitter transistor, the bias signal Bias1 is supplied to the base terminal of the bipolar transistor Tr1. The bias signal Bias1 is a bias current or a bias voltage for controlling a bias point of the bipolar transistor Tr1.

The FET Tr6 serves as a bias circuit which supplies a bias signal Bias2 to the amplifier 220 via the wire 430. The drain terminal of the FET Tr6 is connected to the battery voltage Vbat, and the bias signal Bias2 is input into the gate terminal of the FET Tr6 and is supplied from the source terminal to the amplifier 220 via the wire 430. The base ballast resistor R21 is connected between the input of the amplifier 220 and the wire 430. Similarly, the base ballast resistor R22 is connected between the source terminal of the FET Tr6 and the wire 430. When the bipolar transistor Tr2 is a common-emitter transistor, the bias signal Bias2 is supplied to the base terminal of the bipolar transistor Tr2. The bias signal Bias2 is a bias current or a bias voltage for controlling a bias point of the bipolar transistor Tr2.

The bipolar transistor Tr3 is a transistor in which the base terminal and the collector terminal are connected. Such a connection state is called a diode-connected state. The bipolar transistor Tr3 behaves like a bipolar element which is equivalent to a diode. For the sake of convenience, in this specification, between the two terminals of a diode-connected bipolar transistor, the terminal having a higher potential when the diode-connected bipolar transistor is forward-biased is called an anode, while the other terminal having a lower potential when the diode-connected bipolar transistor is forward-biased is called a cathode. The anode A3 of the diode-connected bipolar transistor Tr3 is connected to the wire 420, while the cathode C3 is grounded within the power amplifier circuit 200. Likewise, the anode A4 of the diode-connected bipolar transistor Tr4 is connected to the wire 440, while the cathode C4 is grounded within the power amplifier circuit 200.

The FET Tr7 is a transistor in which the gate terminal and the drain terminal are connected. Such a connection state is called a diode-connected state. The FET Tr7 behaves like a bipolar element which is equivalent to a diode. For the sake of convenience, in this specification, between the two terminals of a diode-connected FET, the terminal having a higher potential when the diode-connected FET is forward-biased is called an anode, while the other terminal having a lower potential when the diode-connected FET is forward-biased is called a cathode. The anode A7 of the diode-connected FET Tr7 is connected to the gate terminal of the FET Tr5, while the cathode C7 is connected to the wire 420. Likewise, the anode A8 of the diode-connected FET Tr8 is connected to the gate terminal of the FET Tr6, while the cathode C8 is connected to the wire 440.

The diode-connected bipolar transistor Tr3 is thermally coupled with one or plural bipolar transistors Tr1. The distance between the diode-connected bipolar transistor Tr3 and the bipolar transistor Tr1 is about 300 μm or smaller, for example. If the amplifier 210 is formed in a multi-finger structure, the distance between the diode-connected bipolar transistor Tr3 and the finger of the amplifier 210 positioned closest to the diode-connected bipolar transistor Tr3 is about 300 μm or smaller, for example.

Likewise, the diode-connected bipolar transistor Tr4 is thermally coupled with one or plural bipolar transistors Tr2. The distance between the diode-connected bipolar transistor Tr4 and the bipolar transistor Tr2 is about 300 μm or smaller, for example. If the amplifier 220 is formed in a multi-finger structure, the distance between the diode-connected bipolar transistor Tr4 and the finger of the amplifier 220 positioned closest to the diode-connected bipolar transistor Tr4 is about 300 μm or smaller, for example.

The diode-connected FET Tr7 may be thermally coupled with the FET Tr5. Likewise, the diode-connected FET Tr8 may be thermally coupled with the FET Tr6.

If it is necessary to distinguish the wires 410 and 420 from each other, the wire 410 may be called a first wire, and the wire 420 may be called a second wire. Likewise, if it is necessary to distinguish the wires 430 and 440 from each other, the wire 430 may be called a first wire, and the wire 440 may be called a second wire.

The power amplifier module 120 according to the first embodiment achieves the following features.

The FETs Tr5 and Tr6, which serve as bias circuits, are operable at a threshold voltage lower than that of bipolar transistors, thereby making it possible to decrease the operating voltage of the power amplifier module 120. As a result, the power amplifier module 120 can be operated correctly for a longer time even if the battery voltage Vbat somewhat drops.

When the bipolar transistor Tr1 is driven with a constant base-emitter voltage, a collector current increases due to a temperature rise. An increased collector current increases power consumption, which raises the temperature of the bipolar transistor Tr1 and further increases the collector current. This is called positive feedback (thermal runaway). On the other hand, however, the diode-connected bipolar transistor Tr3 and the diode-connected FET Tr7 both exhibit temperature characteristics in which the forward voltage decreases in accordance with a temperature rise. Accordingly, the potential of the gate terminal of the FET Tr5, which serves as a bias circuit, decreases in accordance with a temperature rise, thereby suppressing the occurrence of thermal runaway of the bipolar transistor Tr1. To suppress the occurrence of thermal runaway, it is desirable, not only that the diode-connected bipolar transistor Tr3 and the bipolar transistor Tr1 are thermally coupled with each other, but also that the diode-connected FET Tr7 and the FET Tr5 are thermally coupled with each other. Likewise, the diode-connected bipolar transistor Tr4 and the diode-connected FET Tr8 both exhibit temperature characteristics in which the forward voltage decreases in accordance with a temperature rise. Accordingly, the potential of the gate terminal of the FET Tr6, which serves as a bias circuit, decreases in accordance with a temperature rise, thereby suppressing the occurrence of thermal runaway of the bipolar transistor Tr2. To suppress the occurrence of thermal runaway, it is desirable, not only that the diode-connected bipolar transistor Tr4 and the bipolar transistor Tr2 are thermally coupled with each other, but also that the diode-connected FET Tr8 and the FET Tr6 are thermally coupled with each other.

Inductor components of the wire 410 can prevent high-frequency components of the RF signal from entering the FET Tr5. Similarly, inductor components of the wire 430 can prevent high-frequency components of the RF signal from entering the FET Tr6.

When the diode-connected bipolar transistor Tr3 and the bipolar transistor Tr1 are thermally coupled and also when the diode-connected FET Tr7 and the FET Tr5 are thermally coupled, it is possible to reduce overshooting of a current change which may occur in the case of an excessive response of the bipolar transistor Tr1. Likewise, when the diode-connected bipolar transistor Tr4 and the bipolar transistor Tr2 are thermally coupled and also when the diode-connected FET Tr8 and the FET Tr6 are thermally coupled, it is possible to reduce overshooting of a current change which may occur in the case of a transient response of the bipolar transistor Tr2.

Figure 3:
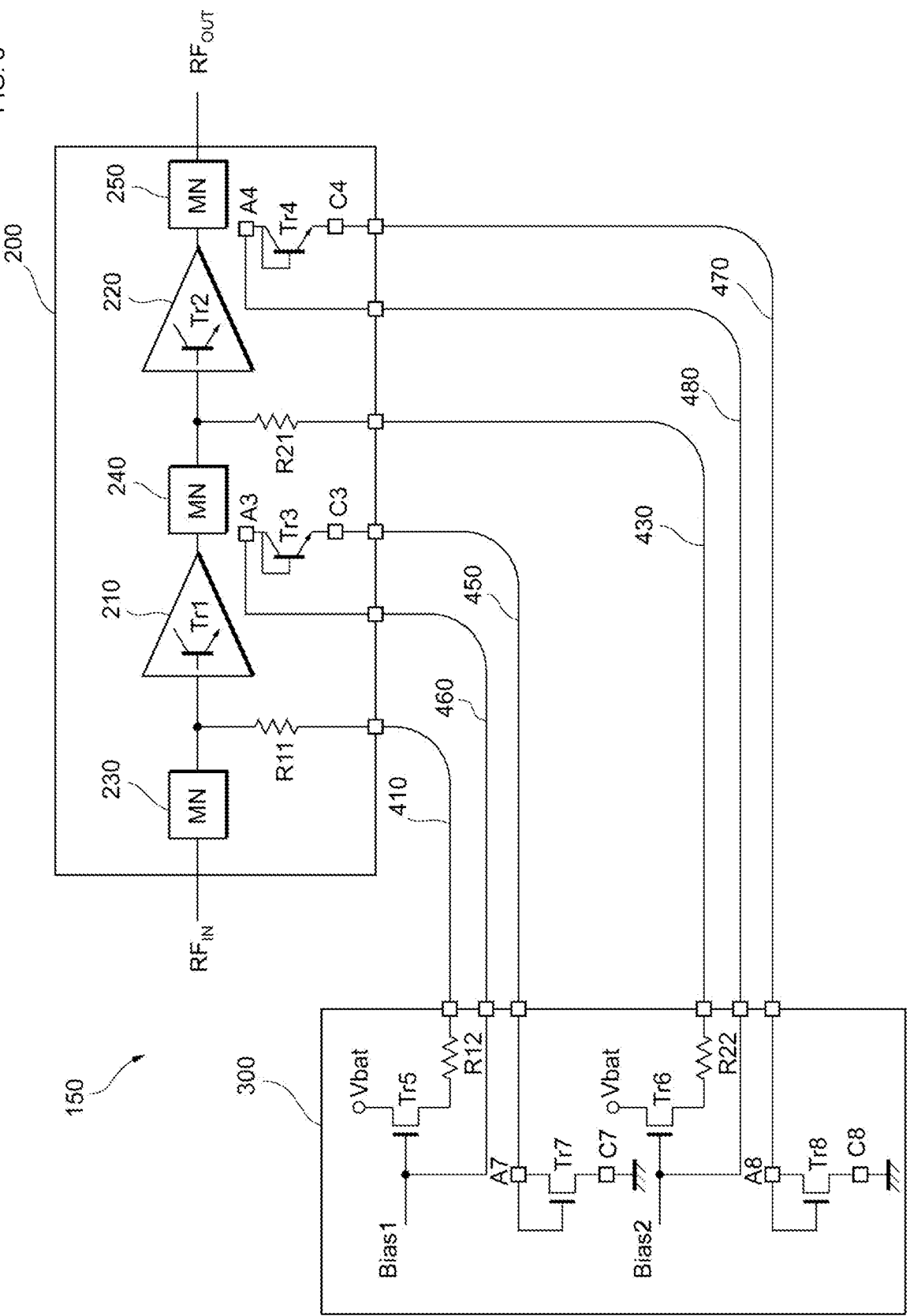
FIG. 3 illustrates an example of the configuration of a power amplifier module according to a second embodiment.

FIG. 3 illustrates an example of the configuration of a power amplifier module 150 according to a second embodiment. The power amplifier module 150 differs from the power amplifier module 120 of the first embodiment in the connection state among the diode-connected bipolar transistor Tr3 (Tr4) within the power amplifier circuit 200, the diode-connected FET Tr7 (Tr8) within the control IC 300, and the FET Tr5 (Tr6) within the control IC 300. The other points of the power amplifier module 150 are the same as those of the power amplifier module 120. The power amplifier module 150 will be described below mainly by referring to the points different from the power amplifier module 120, and a detailed explanation of the same points will be omitted.

The cathode C7 of the diode-connected FET Tr7 is grounded within the control IC 300. The anode A7 of the diode-connected FET Tr7 is connected to the cathode C3 of the diode-connected bipolar transistor Tr3 via a wire 450. The anode A3 of the diode-connected bipolar transistor Tr3 is connected to the gate terminal of the FET Tr5 via a wire 460.

The cathode C8 of the diode-connected FET Tr8 is grounded within the control IC 300. The anode A8 of the diode-connected FET Tr8 is connected to the cathode C4 of the diode-connected bipolar transistor Tr4 via a wire 470. The anode A4 of the diode-connected bipolar transistor Tr4 is connected to the gate terminal of the FET Tr6 via a wire 480.

If it is necessary to distinguish the wires 410, 450, and 460 from each other, the wire 410 may be called a first wire, the wire 450 may be called a second wire, and the wire 460 may be called a third wire. Likewise, if it is necessary to distinguish the wires 430, 470, and 480 from each other, the wire 430 may be called a first wire, the wire 470 may be called a second wire, and the wire 480 may be called a third wire.

Features achieved by the power amplifier module 150 of the second embodiment are similar to those achieved by the power amplifier module 120 of the first embodiment.

Figure 4:
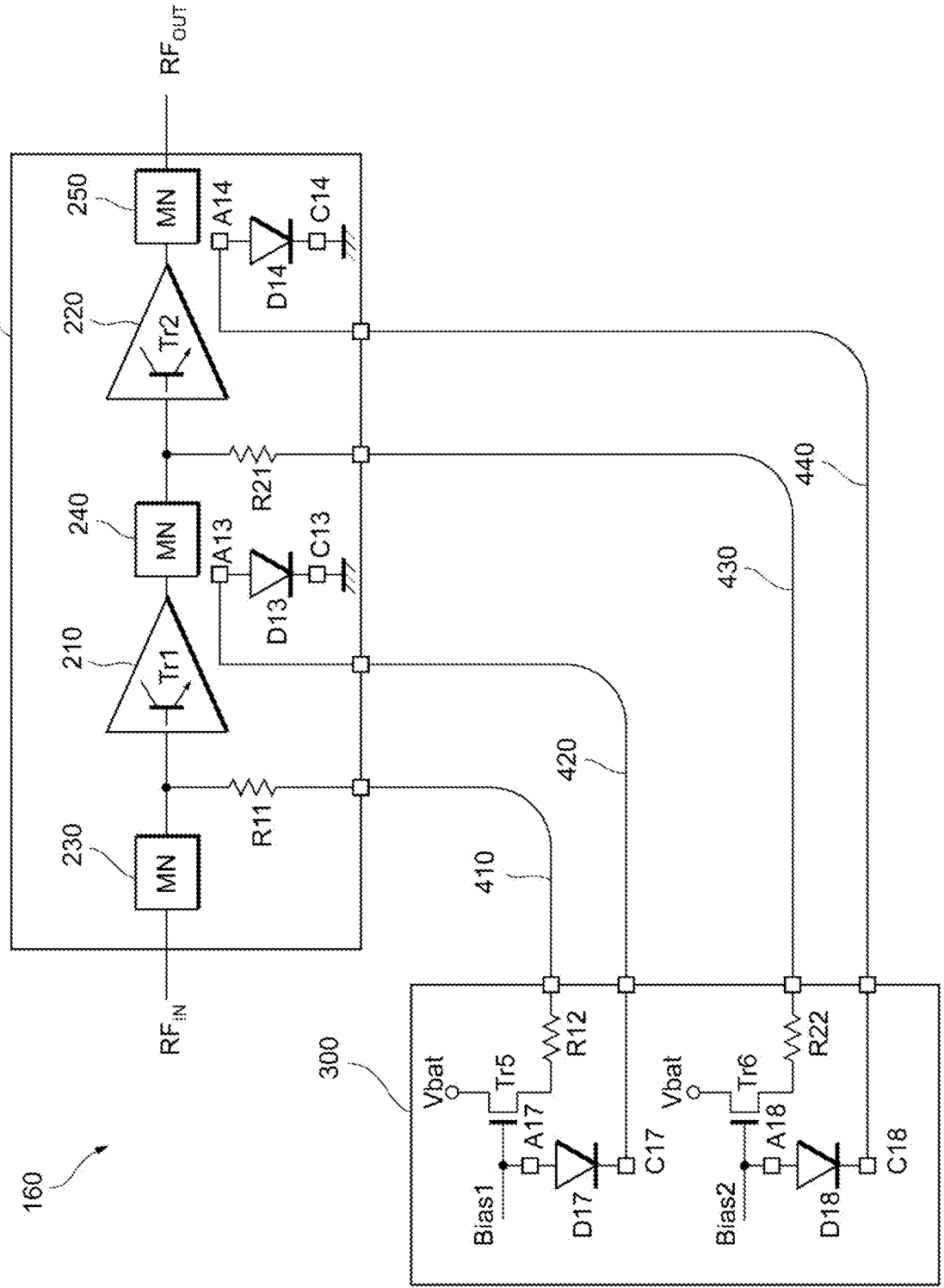
FIG. 4 illustrates an example of the configuration of a power amplifier module according to a third embodiment.

FIG. 4 illustrates an example of the configuration of a power amplifier module 160 according to a third embodiment. The power amplifier module 160 differs from the power amplifier module 120 in that the diode-connected bipolar transistors Tr3 and Tr4 within the power amplifier circuit 200 of the power amplifier module 120 are replaced by diodes D13 and D14, respectively, and the diode-connected FETs Tr7 and Tr8 within the control IC 300 of the power amplifier module 120 are replaced by diodes D17 and D18, respectively. The power amplifier module 160 will be described below mainly by referring to the points different from the power amplifier module 120, and a detailed explanation of the same points will be omitted.

The anode A13 of the diode D13 is connected to the wire 420, while the cathode C13 is grounded within the power amplifier circuit 200. The anode A17 of the diode D17 is connected to the gate terminal of the FET Tr5, while the cathode C17 is connected to the wire 420.

The anode A14 of the diode D14 is connected to the wire 440, while the cathode C14 is grounded within the power amplifier circuit 200. The anode A18 of the diode D18 is connected to the gate terminal of the FET Tr6, while the cathode C18 is connected to the wire 440.

If it is necessary to distinguish the diodes D13 and D17 from each other, the diode D13 may be called a first diode, and the diode D17 may be called a second diode. Likewise, if it is necessary to distinguish the diodes D14 and D18 from each other, the diode D14 may be called a first diode, and the diode D18 may be called a second diode.

Features achieved by the power amplifier module 160 of the third embodiment are similar to those achieved by the power amplifier module 120 of the first embodiment.

Figure 5:
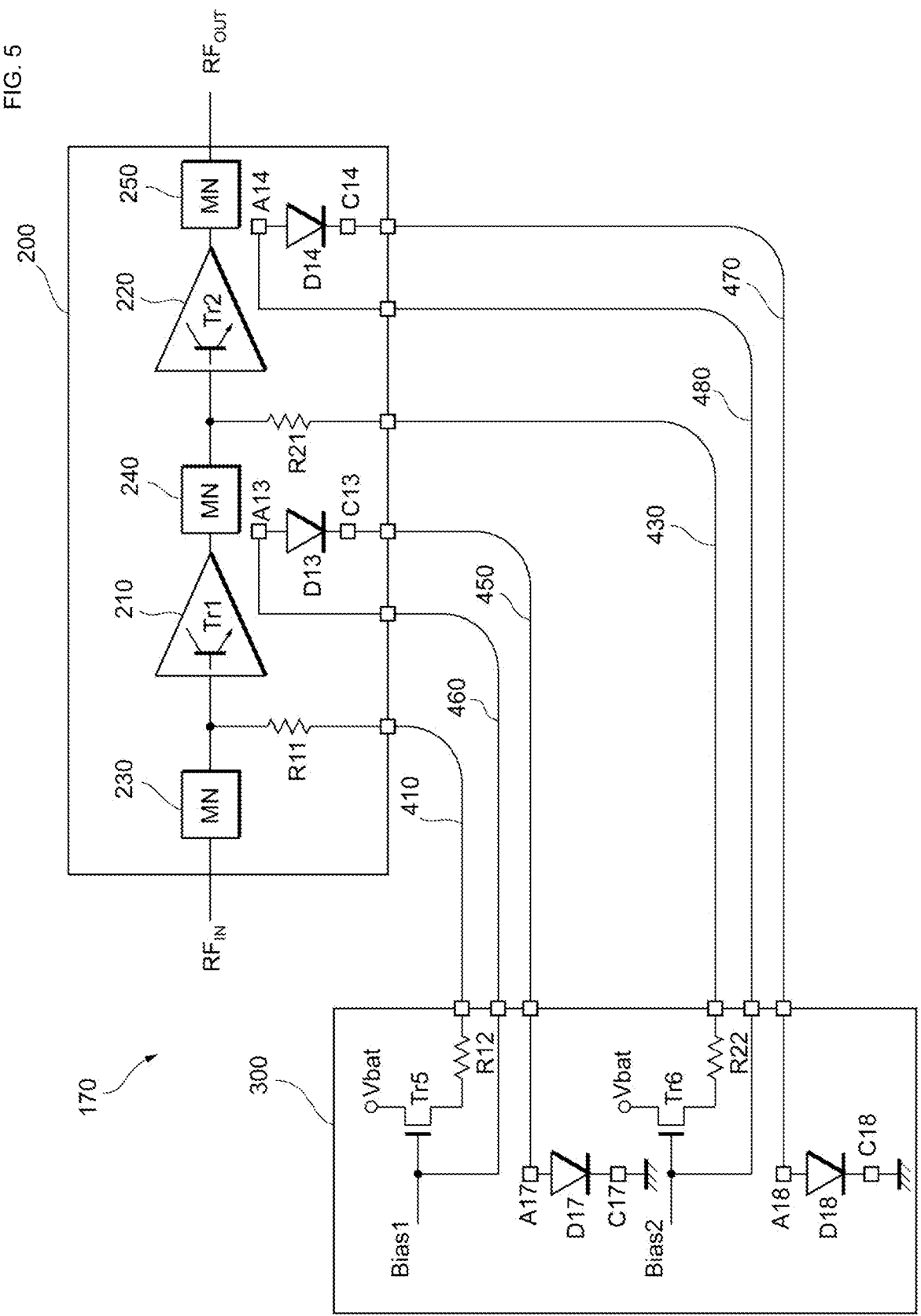
FIG. 5 illustrates an example of the configuration of a power amplifier module according to a fourth embodiment.

FIG. 5 illustrates an example of the configuration of a power amplifier module 170 according to a fourth embodiment. The power amplifier module 170 differs from the power amplifier module 150 of the second embodiment in that the diode-connected bipolar transistors Tr3 and Tr4 within the power amplifier circuit 200 of the power amplifier module 150 are replaced by diodes D13 and D14, respectively, and the diode-connected FETs Tr7 and Tr8 within the control IC 300 of the power amplifier module 150 are replaced by diodes D17 and D18, respectively. The power amplifier module 170 will be described below mainly by referring to the points different from the power amplifier module 150, and a detailed explanation of the same points will be omitted.

The cathode C17 of the diode D17 is grounded within the control IC 300. The anode A17 of the diode D17 is connected to the cathode C13 of the diode D13 via the wire 450. The anode A13 of the diode D13 is connected to the gate terminal of the FET Tr5 via the wire 460.

The cathode C18 of the diode D18 is grounded within the control IC 300. The anode A18 of the diode D18 is connected to the cathode C14 of the diode D14 via the wire 470. The anode A14 of the diode D14 is connected to the gate terminal of the FET Tr6 via the wire 480.

Features achieved by the power amplifier module 170 of the fourth embodiment are similar to those achieved by the power amplifier module 150 of the second embodiment.

The above-described embodiments are provided for facilitating the understanding of the invention, but are not intended to be exhaustive or to limit the invention to the precise forms disclosed. Modifications and/or improvements may be made without departing from the scope and spirit of the invention, and equivalents of the invention are also encompassed in the invention. That is, suitable design changes made to the embodiments by those skilled in the art are also encompassed in the invention within the scope and spirit of the invention. For example, the elements and the positions thereof of the embodiments are not restricted to those described in the embodiments and may be changed in an appropriate manner.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier module comprising:
   a power amplifier circuit comprising:
     a bipolar transistor configured to amplify power of a radio frequency signal and to output an amplified signal, and
     a first diode element; and
   a control integrated circuit comprising:
     a field-effect transistor, and
     a second diode element,
   wherein:
     the first diode element is a diode connected bipolar transistor,
     the second diode element is a diode-connected field-effect transistor, and
     the power amplifier circuit and the control integrated circuit are manufactured on different substrates.

2. The power amplifier module according to claim 1, wherein a drain terminal of the field-effect transistor is connected to a battery voltage.

3. The power amplifier module according to claim 1, wherein a bias signal is input to a gate terminal of the field-effect transistor and is supplied from a source terminal of the field-effect transistor to the bipolar transistor via a first wire.

4. The power amplifier module according to claim 3, wherein an anode of the second diode element is connected to the gate terminal of the field-effect transistor.

5. The power amplifier module according to claim 1, wherein a cathode of the first diode element is grounded.

6. The power amplifier module according to claim 5, wherein an anode of the first diode element is connected to a cathode of the second diode element via a second wire.

7. A power amplifier module comprising:
   a power amplifier circuit comprising:
     a bipolar transistor configured to amplify power of a radio frequency signal and to output an amplified signal; and
   a control integrated circuit comprising:
     a field-effect transistor, and
     a second diode element,
   wherein:
     the second diode element is a diode-connected field-effect transistor,
     the cathode of the second diode element is grounded within the control integrated circuit, and
     the power amplifier circuit and the control integrated circuit are manufactured on different substrates.

8. The power amplifier module according to claim 7, wherein:
   the power amplifier further comprises a first diode element, and
   the first diode element is a diode connected bipolar transistor.

9. The power amplifier module according to claim 7, wherein a drain terminal of the field-effect transistor is connected to a battery voltage.

10. The power amplifier module according to claim 7, wherein a bias signal is input to a gate terminal of the field-effect transistor and is supplied from a source terminal of the field-effect transistor to the bipolar transistor via a first wire.

11. The power amplifier module according to claim 8, wherein:
   a bias signal is input to a gate terminal of the field-effect transistor and is supplied from a source terminal of the field-effect transistor to the bipolar transistor via a first wire, and
   an anode of the first diode element is connected to the gate terminal of the field-effect transistor via a third wire.

12. The power amplifier module according to claim 11, wherein an anode of the second diode element is connected to a cathode of the first diode element via a second wire.

* * * * *